(12) United States Patent
Joist et al.

(10) Patent No.: US 7,983,053 B2
(45) Date of Patent: Jul. 19, 2011

(54) ELECTRONIC PLUG-IN MODULE FOR ACCOMMODATION IN A MODULE RACK

(75) Inventors: Michael Joist, Gaggenau (DE); Rainer Weber, Karlsbad (DE); Klaus-Michael Thalau, Malsch (DE); Paul Rutherford, Karlsruhe (DE)

(73) Assignee: Schroff GmbH, Straubenhardt (DE)

( * ) Notice: Subject to any disclaimer, the term of this patent is extended or adjusted under 35 U.S.C. 154(b) by 431 days.

(21) Appl. No.: 12/350,025

(22) Filed: Jan. 7, 2009

(65) Prior Publication Data

US 2009/0175007 A1 Jul. 9, 2009

(30) Foreign Application Priority Data

Jan. 7, 2008 (EP) .................................. 08000146

(51) Int. Cl.
*H05K 7/00* (2006.01)
(52) U.S. Cl. ........... 361/747; 74/533; 439/188; 333/260
(58) Field of Classification Search .................. 439/157, 439/160, 188, 341; 361/679.41, 600, 732, 361/754, 740, 747, 801, 759, 752, 749; 74/109, 74/533; 200/292; 333/182, 185, 260; 312/333
See application file for complete search history.

(56) References Cited

U.S. PATENT DOCUMENTS

| | | | |
|---|---|---|---|
| 4,364,498 A * | 12/1982 | Kuus et al. ..................... 224/555 |
| 4,884,046 A | 11/1989 | Spinner | |
| 5,226,716 A | 7/1993 | Geil | |
| 5,675,475 A | 10/1997 | Mazura et al. | |
| 5,940,276 A | 8/1999 | Kurrer et al. | |
| 5,982,253 A * | 11/1999 | Perrin et al. ................... 333/182 |
| 5,989,043 A | 11/1999 | Han et al. | |
| 6,094,353 A | 7/2000 | Koerber et al. | |
| 6,128,198 A | 10/2000 | Kurrer et al. | |
| 6,220,879 B1 | 4/2001 | Ulrich | |
| 6,266,248 B1 | 7/2001 | Hanas et al. | |
| 6,354,164 B1 | 3/2002 | Megason et al. | |
| 6,494,729 B1 | 12/2002 | Stathopoulos et al. | |
| 6,515,866 B2 | 2/2003 | Ulrich | |
| 6,741,479 B2 | 5/2004 | Korber et al. | |

(Continued)

FOREIGN PATENT DOCUMENTS

DE 1553608 9/1969

(Continued)

OTHER PUBLICATIONS

European Search Report for Application No. EP08000146, dated Jun. 12, 2008 (6 pages).

(Continued)

*Primary Examiner* — Hung V Duong
(74) *Attorney, Agent, or Firm* — Marc A. Hubbard; Gardere Wynne & Sewell LLP

(57) ABSTRACT

An electronic plug-in module for accommodation in a module rack with a mounting rail, wherein the plug-in module includes a circuit board, a front plate and a mounting device, the mounting device comprises a bearing part, a tensioning part and a fixation element, the bearing part is fixed on front plate, and the tensioning part is connected frictionally to the fixation element and the bearing part in such a manner that a force, by means of which the plug-in module is held with its front plate in a defined position relative to the module rack, is exerted onto the plug-in module transversely to the insertion direction of the plug-in module.

15 Claims, 5 Drawing Sheets

U.S. PATENT DOCUMENTS

| | | |
|---|---|---|
| 7,142,432 B2 | 11/2006 | Koerber et al. |
| 7,284,997 B2 | 10/2007 | Joist |
| 7,455,539 B2 | 11/2008 | Gunther et al. |
| 2002/0057550 A1 | 5/2002 | Ulrich |
| 2002/0182909 A1 | 12/2002 | Stathopoulos et al. |
| 2003/0194892 A1 | 10/2003 | Korber et al. |
| 2004/0192095 A1 | 9/2004 | Joist |
| 2005/0014403 A1 | 1/2005 | Joist |
| 2005/0274592 A1 | 12/2005 | Yang |
| 2007/0165490 A1 | 7/2007 | Simonian |
| 2007/0242423 A1 | 10/2007 | Joist et al. |
| 2008/0031255 A1 * | 2/2008 | Barker et al. ............... 370/395.1 |

FOREIGN PATENT DOCUMENTS

| | | |
|---|---|---|
| DE | 3310474 | 10/1983 |
| DE | 4105948 A1 | 8/1992 |
| DE | 4309973 | 9/1994 |
| DE | 19507712 C1 | 4/1996 |
| DE | 19904763 C1 | 11/2000 |
| EP | 0527608 | 2/1993 |
| EP | 832547 B1 | 4/1998 |
| EP | 832548 B1 | 4/1998 |
| EP | 958719 B1 | 11/1999 |
| EP | 1017262 A1 | 7/2000 |
| EP | 1245139 B1 | 10/2002 |
| EP | 1845765 | 10/2007 |
| GB | 909037 | 10/1962 |
| GB | 2143889 | 2/1985 |
| WO | WO-9642186 A1 | 12/1996 |
| WO | WO-0047028 | 8/2000 |
| WO | WO-0219786 A1 | 3/2002 |

OTHER PUBLICATIONS

Search Report for European Application No. EP05028353, dated Jun. 23, 2006.

Search Report for EP08152211.2, dated Aug. 14, 2008 (8 pages).

* cited by examiner

ELECTRONIC PLUG-IN MODULE FOR ACCOMMODATION IN A MODULE RACK

BACKGROUND OF THE INVENTION

The present invention relates to an electronic plug-in module with a circuit board, a front plate and a mounting device for accommodation in a module rack with a mounting rail, as well as to a mounting device for mounting a front plate on a module rack and to a method for mounting a plug-in module.

For electronic equipment of modular construction such as module racks, it is common to design individual modules in the form of plug-in modules. The modules usually have a multipole connector on their back side that is inserted into a plug receptacle on the backplane of the module rack. On their front side, the plug-in modules usually have a front plate that is flush with the front side of the module rack. The module groups run in guiderails of the module rack, and are inserted into the module rack and pulled out of it in this manner.

In order to hold the plug-in modules in position, they are fixed by appropriate means on a module rack to prevent unintended loosening. In the usual locking of the plug-in modules by means of screws or snap buckles, the back side of the plug-in modules front plate stops at a mounting plane. For example, the plug-in modules are screwed into a mounting rail of the module rack with a screw through the front plate. In this case, the front plate is pressed by means of the screw towards the module rack until the front plate rests against a mounting rail that has the threads or a thread channel for the mounting screws.

Leveraging plug-in modules into a module rack by means of a lever latch handle is also known. The levers can be secured by a variety of mechanisms against unintended pivoting and, therefore, an unintended detachment of the plug-in module.

A new form of plug-in modules, which are primarily employed in modern telecommunications systems, is designed according to a standard (AMC standard, Advanced Mezzanine Card standard) developed by the PICMG (PCI Industrial Manufacturers Group). Plug-in modules according to this specification are relatively small in comparison to 19" modules and have a front plate having a U-shaped cross section mounted at the front of the circuit board. At their rear end, the cards have a plug-in edge (card edge).

In the new plug-in modules, however, the previously familiar mounting flange with locking elements is lacking, since the modules are to be inserted into so-called carriers (adapters) that have no corresponding mounting plane or mounting rail. The depth stopping of the modules inside the carriers is accomplished by means of the rear edge of the circuit board at the base of the carrier's plug casing. The depth stop is required for a secure contact transfer of the individual contact rows of the plug connector. The locking mechanism of the modules specified by the standard secures their final position.

Because of the tolerances established and allowed in the standard for the individual components, especially for the plug-in modules and the module racks, it is not possible to provide mounting flanges on the front plate that stop against a mounting rail of the module rack and, in this way, simultaneously assure the contacting of the plug-in module with its rear edge. For instance, screwing the front plate to the module rack would have the effect of exertion of excessive pressure by the integrated plug of the plug-in module on the plug casing of the module rack. This could cause destruction.

Previously known locking systems for such plug-in modules with card edge systems are described in EP 06008996.8 for example. Due to the increased burdens with regard to shock and vibration resistance that are currently established in the standards, the mounting systems are reaching their limits. The obvious suggestion of screwing the front plate to the mounting rails of the module rack is out of the running due to the tolerance equalization required. As already mentioned above, mounting with mounting screws would lead to strains on the circuit board and cause malfunctioning.

SUMMARY

The invention, in a preferred form, addresses one or more technical problems for overcoming one or more disadvantages of the prior art and, in particular, mounting electronic plug-in modules in a module rack.

An example of a plug-in module according to a preferred embodiment of the invention can be pushed into and held in a module rack with a front mounting rail. The plug-in module comprises a circuit board, a front plate and a mounting device. The mounting device includes a bearing part, a tensioning part and a fixation element. The mounting device is arranged on a front plate of the plug-in module. The bearing part is mounted on a front side of a front plate, so that the bearing part is visible from the outside. The bearing part has an axial bore into which the tensioning part of the mounting device can be inserted. The tensioning part is movable inside the bearing part and fixed only by the fixation element, which extends through the tensioning part. The fixation element is likewise movable in the tensioning part. The tensioning part and/or the fixation element is preferably constructed such that it cannot fall out.

An electronic plug-in module with such a mounting device, in which the bearing part is fixed on the front plate and the tensioning part is movable in the bearing part, as well as the fixation element, which is itself movable in the tensioning part, can be introduced into a module rack and fixed therein if it has a mounting rail. To this end, the fixation element interacts with the mounting rail of the module rack when the plug-in module and its front plate are in a defined position relative to the module rack, or relative to the mounting rail. The tensioning part, the fixation element and the bearing part can then be connected to one another with a friction fit such that the plug-in module is fixed in position. The forces exerted by the fixation element, the tensioning part and the bearing part during the fixation act transversely to the direction in which the plug-in module is inserted into the module rack, so that the plug-in module remains uninfluenced in its defined position relative to the module rack. The plug-in module is thus fixed in any desired position relative to the module rack. The only prerequisite is that the fixation element of the mounting device be able to interact with the mounting rail of the module rack. It is possible to position the plug-in module such that a back side of the front plate rests against the mounting rail of the module rack. It is also possible, however, to fix the plug-in module such that a defined gap is maintained between the back side of the front plate and the mounting rail. This gap is preferably up to a few millimeters in size, especially preferably less than 3 mm, and very preferably less than 2 mm.

The bearing part has an axial bore into which the tensioning part can be introduced and moved in the axial direction. A through-bore of the tensioning part is advantageously arranged coaxially to the bore of the bearing part. The term "bore" is to be understood to mean that a hole or an opening, a through-hole for example, is present. The production of the bore is not limited to mechanical boring. The bore need not be necessarily round; it can have other cross-sectional shapes. The mounting element of a special embodiment extends through the tensioning part inserted in the bearing part and interacts (in the assembled condition) with the module rack. The fixation element, for example a screw, is inserted into an opening in the mounting rails of the module rack using a screw as a fixation element, the mounting rail is preferably threaded.

The tensioning part is preferably arranged in the bearing part in such a manner that slippage of the tensioning part out of the bearing part is prevented. This is important so that the tensioning part cannot be lost before the plug-in module is fixed in the module rack. The same applies to the fixation element of the mounting device, which element is arranged such that it is prevented from slipping or falling out of the tensioning part while the fixation element is not interacting with the mounting rail of the module rack. The mounting rail advantageously has several bores on its contact surface for the front plate that correspond to the fixation element preferably constructed as a screw. The fixation element can be fixed in the bore. The bore can have a thread just like the screw, for example. It is also possible for the fixation element to interact with the bore of the fixation element by means of a bayonet lock.

In an advantageous embodiment, the through-bore of the tensioning part has a funnel-shaped widened section at the remote end, facing away from the module rack. The fixation element has a conical section that corresponds to the funnel-shaped widened section of the tensioning part. The conical section of the fixation element here can exert a force onto the widened section of the tensioning part, so that the tensioning part is connected to the fixation element and the bearing part in a clamping manner (nonpositively).

Depending on the tolerances between the front plate of the plug-in module and a mounting plane defined by a mounting rail in the front area of the module rack, a gap can arise if the plug-in module has securely contacted the plug receptacle of the module carrier with its card edge located at its rear edge. The plug-in module must be held in this position. It must not be pushed further into the module rack or pulled further out of it. The gap resulting in this end position has a width of 0 to roughly 1.6 mm.

The mounting plane of the module rack defined by the mounting rails corresponds to the contact surface of the mounting rail for the front plate of the plug-in module. So that the front plate of the plug-in module can rest against the mounting rail, i.e., contact the contact surface of the mounting rail, the bearing part preferably has at its front end a collar extending into a bore of the front plate. The bearing part here is fixed to the front side of the front plate in such a manner that the collar extends through the bore, with the collar ending flush with the back side of the front plate. In this manner, a flat and smooth back side of the front plate that is not disrupted by the bearing part is achieved. The front plate can rest against the mounting rail without a gap.

The bearing part advantageously has a recess that corresponds to a collar of the tensioning part on the end pointing towards the front plate. In this manner, the collar of the tensioning part can penetrate into the recess in such a manner that the tensioning part ends flush with the back side of the front plate. The smooth contact of the front plate on the mounting rail is promoted by this preferred embodiment.

The mounting device comprising the bearing part, the tensioning part and the fixation element, is used in order to fix the plug-in module in this end position. The fixation element, which is preferably a screw, is driven into the mounting rail of the module rack through the tensioning part and the front plate. While being driven in, the fixation element exerts a force on the tensioning part in such a manner that a motion of the front plate relative to the module rack becomes impossible. During fixation and the creation of the force-fit connection, during screwing-in for example, a force transverse to the insertion direction is exerted onto the tensioning part and/or the bearing part fixed in the front plate. The expression "transverse to the insertion direction" is understood to mean that the force component in the insertion direction is markedly smaller than the component exerted transversely to the insertion direction, so that no motion of the components in the insertion direction occurs. It is assured in this manner that the plug-in module is not pressed against the module rack, whereby a further insertion into the module rack is prevented.

The mounting device is also suitable for mounting front plates on the module rack that are not connected to any plug-in module insertable into the mounting rack. Such front parts (front plates) serving as covering plates can likewise be fixed by means of the fixation device directly, or with a small desired gap, on the module rack. Thereby a uniform appearance of the front side of an only partially populated module rack can be produced, even if several plug-in sites are populated with cover plates.

It has been found that a fixation device as described above is capable of a reliable and robust positioning and fixation of the plug-in module in the module rack. Even in case of collisions with a high collision amplitude, or in case of strong vibrations of the module rack and/or the plug-in module, it is held in its position in the module rack.

The force-fit connection of fixation element, tensioning part and bearing part is configured such that a force oriented transversely to the insertion direction of the plug-in module is exerted onto the bearing part. A force component in the insertion direction is negligible and does not lead to an additional force on the circuit board.

The tensioning part of the mounting device is preferably formed as a (cylindrical) sleeve or an expansion sleeve. It can be formed as a rectangle, a hexagon or a polygon. The outer contour of the tensioning part can be adapted to the bore of the bearing part such that rotation of the tensioning part in the bearing part is allowed or prevented. At one end of the expansion sleeve, clamping jaws, clamping tongues or spreading tongues that are movable radially (i.e., transverse to the insertion direction) can be formed preferably in its outside surface. In this manner, the expansion sleeve can be widened by inserting the fixation element, so that the force-fit connection to the bearing part is produced. The clamp tongues of the tensioning part are formed resiliently in a preferred embodiment. Preferably, incisions are provided in the outside surface of the expansion sleeve between the clamp tongues.

In a preferred embodiment, the bearing part is integrally connected to the front plate of the plug-in module. The bearing part can be soldered, riveted, pressed together with, welded or glued to the front plate. It is also possible to provide a front plate in which the bearing part is integrated, for instance with front plates made of pressure-cast metal or of plastic.

A preferred embodiment of a module rack for electronic plug-in modules, with a mounting device for fixation of a front plate on the module rack, will be described below with reference to the drawings. The technical characteristics presented therein can be used individually or in combination to create other embodiments of the invention. They do not constitute a limitation of the generality of the invention.

DETAILED DESCRIPTION OF EXEMPLARY EMBODIMENTS

In the following description, like numbers refer to like elements.

Figure 1:
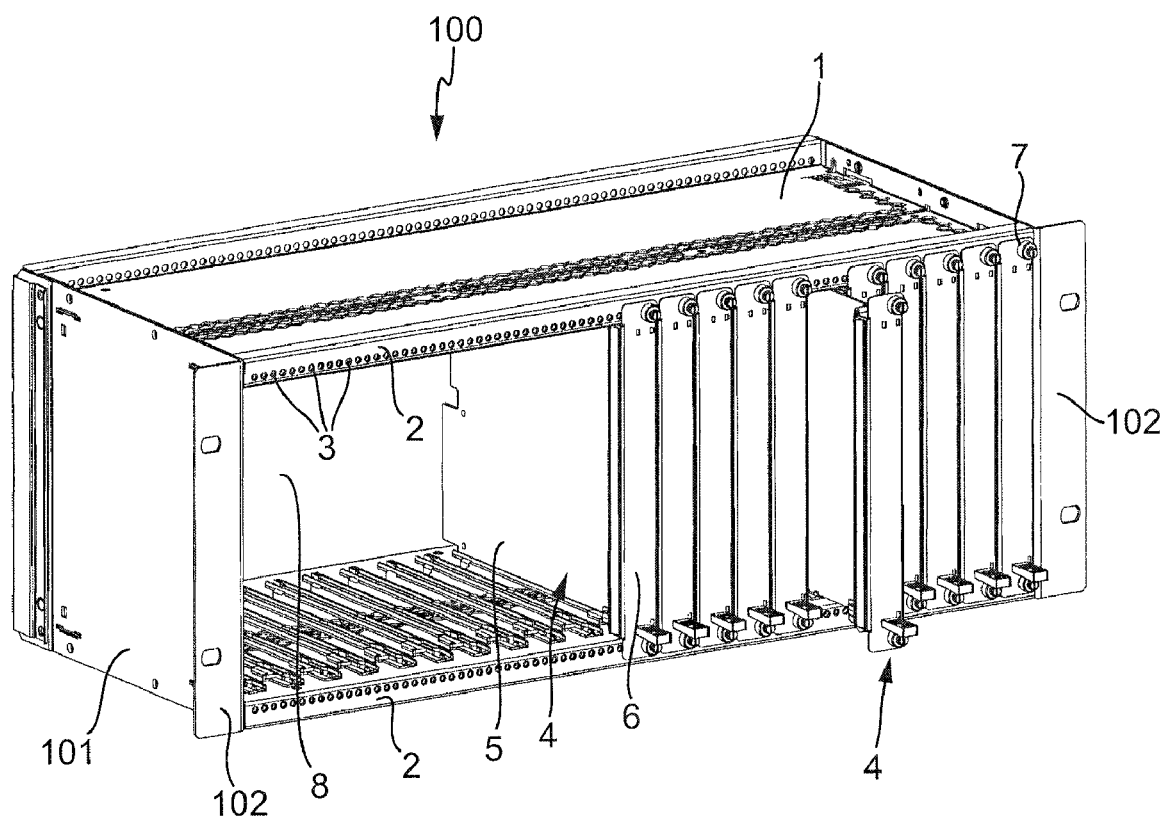
FIG. 1 shows a system with a module rack with a plurality of plug-in modules.

FIG. 1 shows an electronic system 100 with a module rack 1 according to the invention, with two side walls 101, each with a mounting bracket 103 for accommodation in a housing cabinet. On its front side, module rack 1 has two mounting rails 2, implemented as hole strips, running parallel between sidewalls 101. Mounting rails 2 have a plurality of mounting holes 3 with threads. In place of mounting holes 3, a screw-thread channel could be present in mounting rails 2.

The module rack 1 according to the invention as shown is partially populated with several plug-in modules 4 having a circuit board 5 and a front plate 6. At their upper and lower end, front plates 6 each have a bore 7, through which a fixation element can be screwed into one of the mounting holes 3. An optional handle part, with which module 4 can be brought into its position, is arranged in the area of the lower end of front plate 6.

At the rear edge of circuit board 5, a card-edge is formed, which engages in the inserted state of module 4 in module rack 1 with a plug-in receptacle, not shown here, of backplane 8 of module rack 1.

Figure 2:
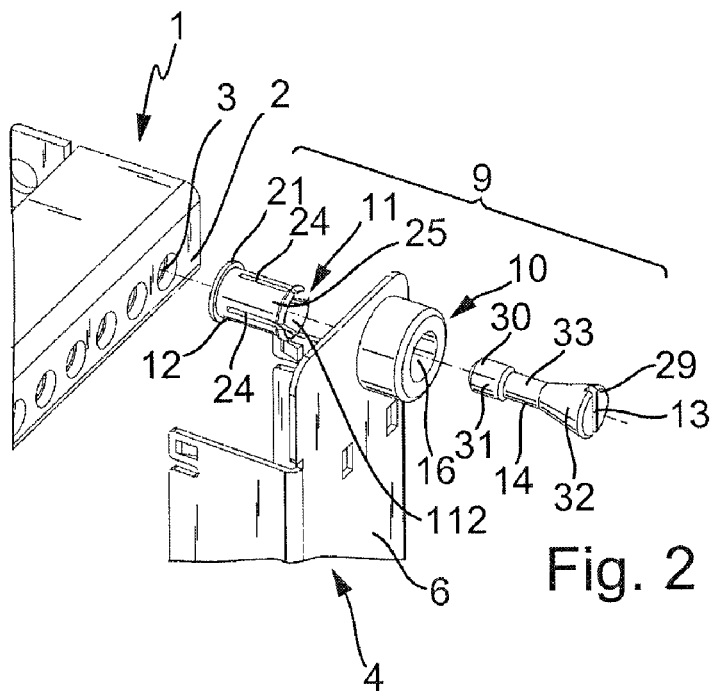
FIG. 2 is an exploded view of a part of the system from FIG. 1.
Figure 3:
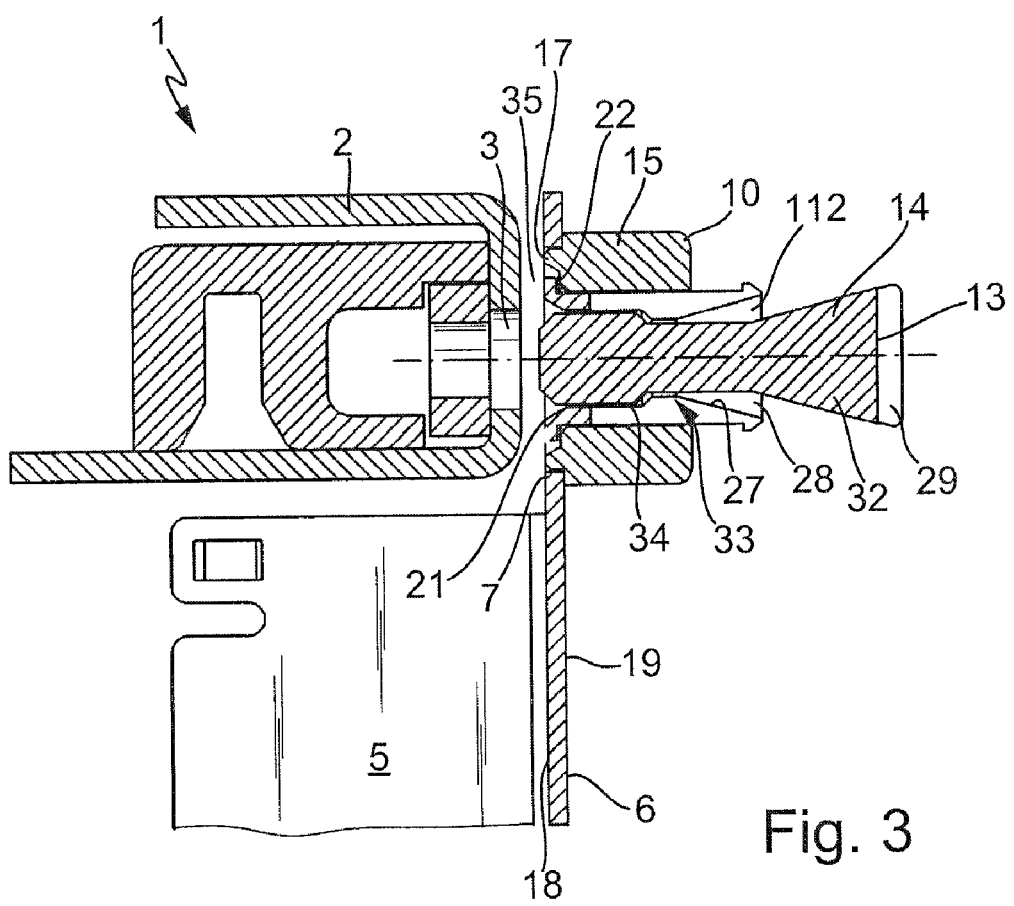
FIG. 3 is a cross section through a front part of the module rack during insertion of the plug-in module.

FIGS. 2 and 3 show the module 4 according to the invention that is fixed in module rack 1 with a mounting device 9. The mounting device 9 according to the invention comprises a bearing part 10, a tensioning part 11, constructed as an expansion sleeve 12 with a through-bore 112, and a fixation element 3, which is a conical-head screw 14 in the preferred embodiment.

Before plug-in module 4 is inserted into module rack 1 and fixed therein, bearing part 10 is fixed to front side 19 of front plate 6. In an additional step, tensioning element 11, constructed as an expansion sleeve 12, is inserted into bearing part 10 from the back side of the front plate. Expansion sleeve 12 protrudes axially from bearing part 10 and is movable back and forth in the bearing part. As soon as tensioning part 11 is arranged in the bearing part, fixation element 13 is inserted into expansion sleeve 12 from the front. A thread preferably engages at one end of fixation element 13 in a corresponding thread of expansion sleeve 12, so that fixation element 13 can be screwed through expansion sleeve 12 until the thread of fixation element 13 again protrudes from the expansion sleeve. The fixation element can then be moved in the expansion sleeve, but it cannot accidentally fall out. This is assisted by the shape of conical-head screw 14.

As soon as mounting device 9, consisting of bearing part 10, tensioning part 11 and fixation element 13, is arranged on front plate 6, plug-in module 4 is inserted into module rack 1. It can now be fixed in a desired position in the module rack, as is described in detail with reference to FIGS. 3-7.

It can be seen from FIGS. 2 and 3 that bearing part 10 is a cylindrical bearing sleeve 15 with an axial bore 16. At one end, bearing sleeve 15 has a nose (centering collar) 17 that extends into bore 7 of front plate 6 when bearing sleeve 15 is fixed to front plate 6. The length (axial dimension) of nose 17 corresponds to, at most, the thickness of front plate 6, so that nose 17 lies flush with the back side 18 of front plate 6.

Figure 8:
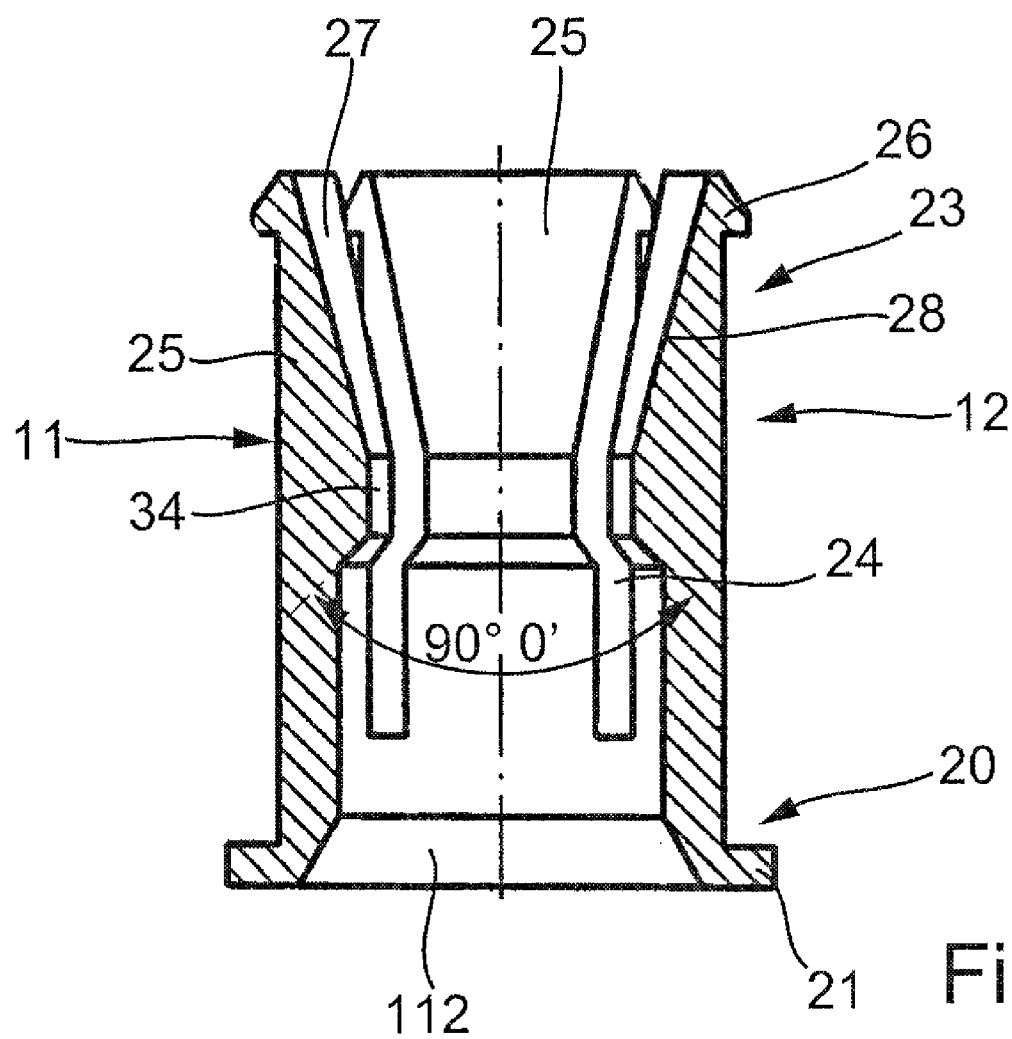
FIG. 8 is a cross section through a tensioning part of the mounting device.

Expansion sleeve 12, shown with its through-bore 112 in FIG. 2 and (as a sectional view) in FIG. 8, has at a (first) end 20 a collar 21 that corresponds to a recess 22 of bearing sleeve 15 such that when inserted into bearing sleeve 15, expansion sleeve 12 ends flush with bearing sleeve 15 and the back side 18 of front plate 6.

Several incisions 24 preferably extend in the axial direction from an end 23 opposite from collar 21. Their length corresponds to roughly 80% of the length of expansion sleeve 12. Tensioning strips 25, which act as spreading elements or clamp jaws, are formed between adjacent axial incisions 24. Locking tabs 26 that taper in a hook shape in the direction of end 23 are formed on the outer side of end 23 of expansion sleeve 12. If expansion sleeve 12 is inserted from backside 18 of front plate 6 into bearing sleeve 15, then tensioning strips 25 are compressed in such a manner that expansion sleeve 12 can be pushed into bearing sleeve 15. The preferred locking tabs 26 on tensioning strips 25 prevent slippage or undesired movement of tensioning part 11 out of bearing part 10.

At its end 23, expansion sleeve 12 preferably has a funnel-shaped widened section 27 on the inside of through-bore 112. It is realized by a chamfer 28, preferably having an angle of, at most, 30°, particularly preferably at most 20° and further preferably of, at most, 10°. In the embodiment shown, the widened section 27 has an angle of ca. 15°. Widened section 27 or its chamfer 28 corresponds to the inclination of a conical end 29 of conical-head screw 14.

In FIGS. 2-7, conical-head screw 14 has a thread 31 at its end 30, with which it can be inserted into mounting holes 3 of mounting rail 12. Conical-head screw 14 preferably has a conical section 32 at end 29. In a preferred embodiment, an intermediate section 33, the diameter of which is preferably less than the diameter of threaded piece 31, is formed between thread 31 and conical section 32. An inside thread 34, corresponding to thread 31, in through-bore 112 of expansion sleeve 12 (preferably adjoining widened section 27) prevents conical-head screw 14 from falling out of expansion sleeve 12.

FIGS. 3-7 show a cross section through the upper part of module 4 and mounting rail 2 of module rack 1.

In order to mount plug-in module 4 with front plate 6 in module rack 1 according to the invention, bearing part 10 is first fixed to front side 19 of front plate 6. Tensioning part 11 is preferably inserted into bore 16 of bearing part 10 from the back side 18 of front plate 6. Tensioning part 11 is preferably compressed in such a manner at its end 23, on which the incisions 24 are situated, that it fits through bore 16 of bearing part 10. Since tensioning part 11 is preferably longer than bearing part 10, it protrudes axially from bearing part 10 and is movable axially. Collar 21 and locking tabs 26 of tensioning part 11 prevent slippage out of bearing part 10. Through-bore 112 of tensioning part 11 is aligned with bore 16 of bearing part 10.

Plug-in module 4 with its circuit board 5 is inserted in FIG. 3 sufficiently into module rack 1 that a gap 35 arises between front plate 6 and mounting rail 2. Nose 17 of bearing sleeve 10 ends flush with back side 18 of front plate 6. Expansion sleeve 12 is positioned in bearing sleeve 15 in such a manner that its collar 21 rests on the corresponding recess 22 of bearing sleeve 15 and ends flush with back side 18 of front plate 6. End 23 of expansion sleeve 12 protrudes from bearing sleeve 15. Conical-head screw 14 is arranged in expansion sleeve 12 in such a manner that its conical section 32 is spaced apart from expansion sleeve 12 and its widened section 27. Conical-head screw 14 is inserted or screwed into expansion sleeve 12, but not yet screwed into mounting rail 2.

In the next step after insertion of plug-in module 4 into module rack 1 to a desired position, fixation element 13 is further inserted into tensioning part 11 in the module insertion direction (FIG. 4) before it is screwed into mounting rail 2.

Figure 4:
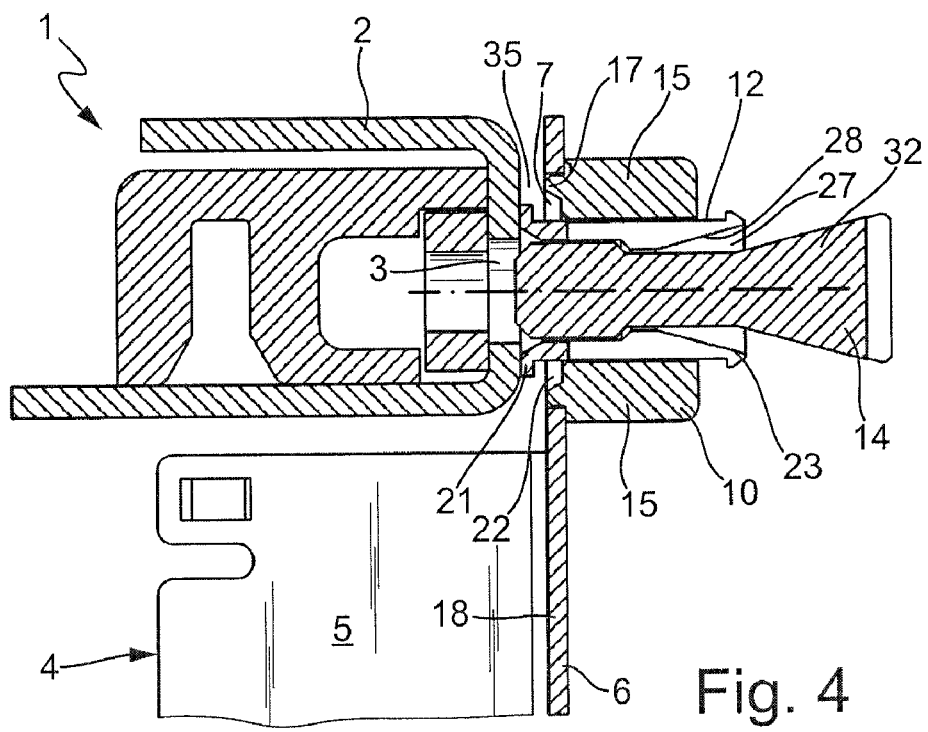
FIG. 4 is a section through the module rack of FIG. 3 at the beginning of the screwing-in of a fixation element.

In FIG. 4, the movably seated expansion sleeve 12 in bearing part 10 is displaced sufficiently in the insertion direction that its collar 21 rests against mounting rail 2. Since expansion sleeve 12 is displaceable in bearing sleeve 15, front plate 6 and plug-in module 4 have remained in their position.

As soon as conical section 32 of fixation element 13 interacts with the corresponding chamfer 28 of widened section 27 of tensioning part 11, expansion sleeve 12 is pressed apart transversely to the insertion direction in such a manner that expansion sleeve 12 is widened, and a frictional connection arises between tensioning part 11 and bearing part 10. Expansion sleeve 12 is clamped between conical-head screw 14 and bearing sleeve 15. Plug-in module 4 is fixed in the defined position relative to module rack 1 and remains unchanged, even during the application of force since the force exerted on bearing part 10 is oriented transversely to the insertion direction. Shifting of plug-in module 4 or front plate 6 in or opposite to the insertion direction is out of the question.

This brings about the advantage that plug-in module 4 can be fixed to module rack 1 by a screw. Thereby, a reliable and robust fixation of the position of plug-in module 4 can be realized. Even in case of high requirements with respect to shocks or vibrations, the mounting is reliably held. At the same time, plug-in module 4 is not pulled against mounting rail 2 of module rack 1 during fixation with conical-head screw 14, but instead remains in the desired position. A gap 35 existing between mounting rail 2 and front plate 6 of plug-in module 4 is preserved and unchanged. Forces acting in the insertion direction on plug-in module 4 are prevented. Thus, the danger that damage to or destruction of circuit board 5 of plug-in module 4, or backplane 8 of module rack 1, might arise due to the mounting process is eliminated.

Figure 5:
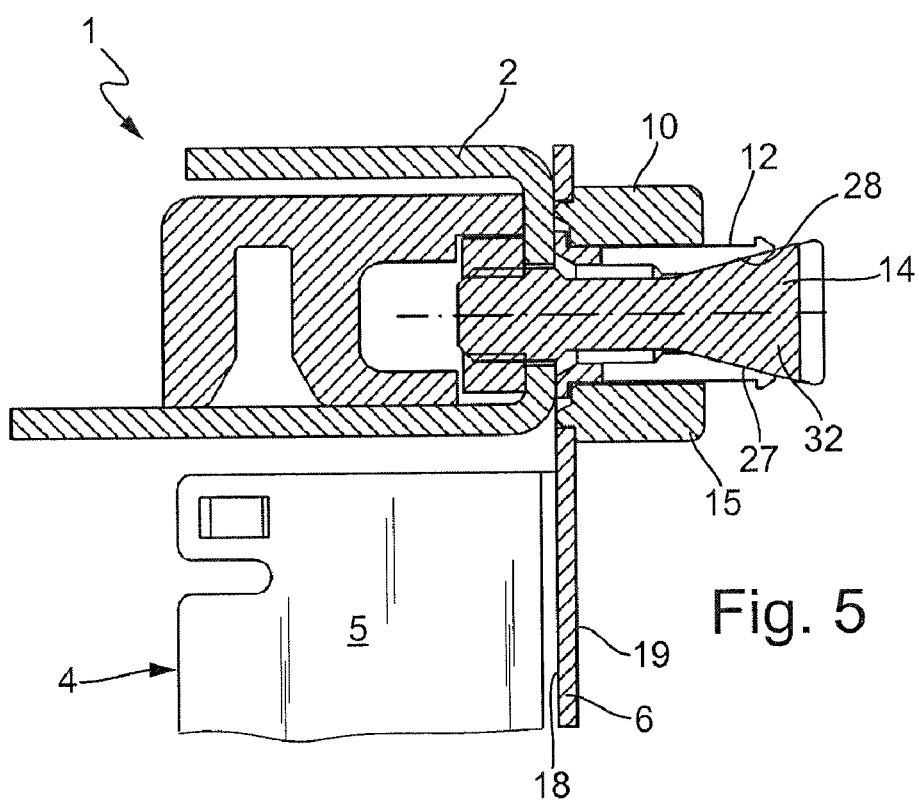
FIGS. 5-7 are a section through the module rack of FIG. 3 with the plug-in module fixed in different positions.
Figure 6:
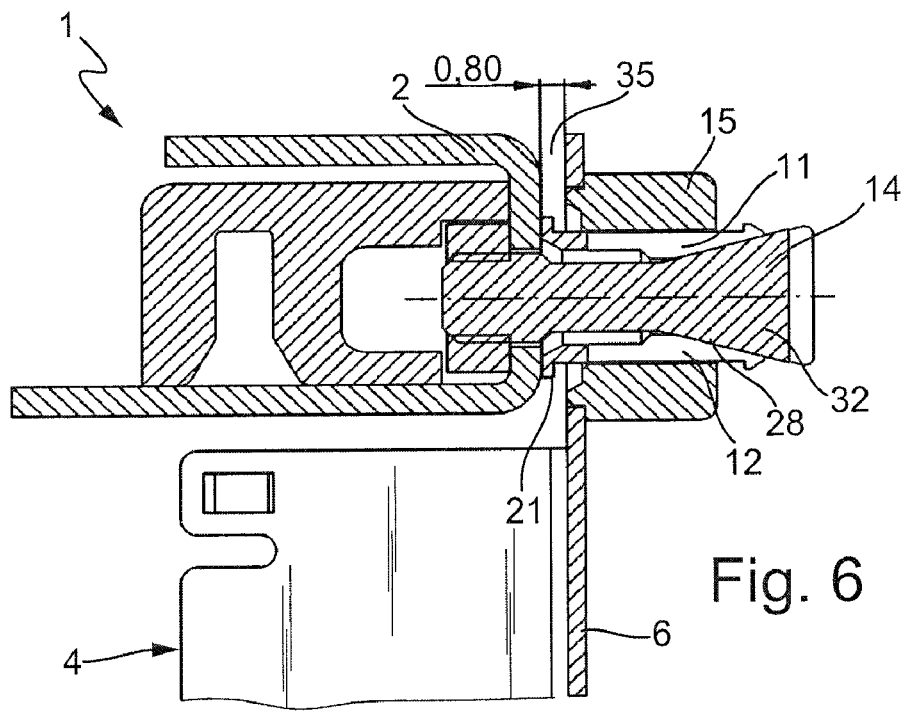
Figure 7:
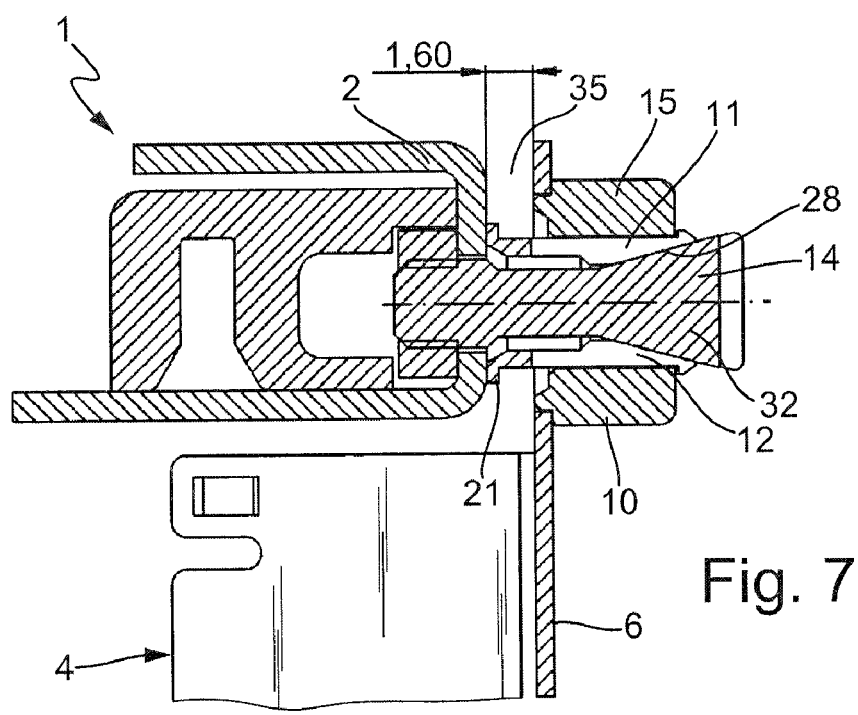

FIGS. 5-7 show the secured plug-in module 4 when conical-head screw 14 has been screwed into mounting hole 3 of mounting rail 2. FIGS. 5-7 differ in the width of gap 35 between front plate 6 and mounting rail 2.

In FIG. 5, plug-in module 4 is pushed in sufficiently that front plate 5 rests against mounting rail 2. In FIGS. 6 and 7, a gap 35 of 0.8 and 1.6 mm, respectively, is formed between mounting rail 2 and front plate 6. In the secured state of plug-in module 4, expansion sleeve 12 always rests with its collar 21 against mounting rail 2 in the embodiment shown here.

The foregoing description is of an exemplary and preferred embodiments employing at least in part certain teachings of the invention. The invention, as defined by the appended claims, is not limited to the described embodiments. Alterations and modifications to the disclosed embodiments may be made without departing from the invention. The meaning of the terms used in this specification are, unless expressly stated otherwise, intended to have ordinary and customary meaning and are not intended to be limited to the details of the illustrated structures or the disclosed embodiments.

What is claimed is:

1. Apparatus comprising an electronic plug-in module for accommodation in a module rack, the electronic plug-in module comprising:
    a circuit board, a front plate and a mounting device; wherein the mounting device is arranged on the front plate and comprises a bearing part, a tensioning part and a fixation element, the bearing part is fixed to a front side of the front plate and has an axial bore into which the tensioning part can be inserted, and the tensioning part is connected frictionally to fixation element and bearing part in such a manner that a force, by means of which plug-in module is held with its front plate in a defined position relative to module rack, is exerted onto plug-in module transversely to the insertion direction of plug-in module in module rack.

2. An apparatus according to claim 1, wherein the tensioning part is arranged in bearing part such that slippage of the tensioning part out of the bearing part is prevented.

3. An apparatus according to claim 1, wherein the bearing part is fixed to the front plate in such a manner that the bearing part ends flush with the back side of front plate.

4. An apparatus according to claim 3, wherein the tensioning part extends through the axial bore of the bearing part in such a manner that the tensioning part ends flush with the back side of the front plate.

5. An apparatus according to claim 4, wherein the tensioning part rests against a mounting rail of a module rack in a mounted position in which the plug-in module is fixed in the module rack.

6. An apparatus according to claim 1, wherein the tensioning part comprises a through-bore for receiving the fixation element, the through-bore comprising a section having a funnel-shape and a funnel shaped widened section, and a fixation element is comprised of a conical section that corresponds to the funnel-shaped section of the through-bore of the tensioning part.

7. An apparatus according to claim 1, wherein the plug-in module is adapted to be fixed in position in a module rack in such a manner that a gap is maintained between the front plate of the plug-in module and a mounting rail of the module rack.

8. An apparatus according to claim 1, wherein tensioning part has at least one clamp jaw that spreads in two or more directions.

9. An apparatus according to claim 1, wherein the tensioning part comprises a sleeve, at one end of which a tensioning strip that is movable in the radial direction is arranged.

10. An apparatus according to claim 9, wherein the tensioning part includes a bore, the bore having a funnel shaped section at one end of the tensioning part, the tensioning strip being arranged near the funnel-shaped section.

11. An apparatus according to claim 9, wherein the sleeve of the tensioning part is of resilient construction.

12. An apparatus according to claim 1, wherein the bearing part is integrally joined to the front plate of the plug-in module.

13. An apparatus according to claim 1, further comprising a module rack with a mounting rail in its front area, wherein the electronic plug-in module is adapted to be fixed in a defined position in the module rack without forces being exerted in the insertion direction of plug-in module during the fixation.

14. A mounting device for a front plate of a plug-in module for mounting on a module rack with a mounting rail, the mounting device comprising a bearing part, a tensioning part and fixation element, wherein:
    the bearing part comprises a cylindrical bearing sleeve that has a bore and can be fixed to the front plate,
    the tensioning part protrudes from the bearing part in the axial direction and is movably seated in the bore of the bearing part, the tensioning part has a through-bore, and the fixation element extends through the though-bore of the tensioning part and is movably seated in the through-bore when the bearing part is fixed to the front plate and the tensioning part is arranged in the bearing part;

whereby, when the fixation element is fixed to the mounting rail of the module rack, the fixation element is frictionally connected to the tensioning part, such that the bearing part, the tensioning part and the fixation element are fixed in a defined relative position to one another, and such that force occurring on the bearing part and the plug-in module during the fixation are oriented transversely to the insertion direction of the plug-in module, with the tensioning part resting against the mounting rail.

15. A method for mounting a plug-in module with a front plate on a module rack with a mounting rail by means of a mounting device comprising a bearing part, a tensioning part and a fixation element, the method comprising:

fixing the bearing part with an axial bore on the front side of the front plate of the plug-in module, inserting the tensioning part into the bore of the bearing part from the back side of the front plate of the plug-in module in such a manner that the tensioning part is displaceable in the bearing part, and a through-bore of the tensioning part is aligned with the bore of the bearing part, inserting the plug-in module into the module rack until the plug-in module and its front plate are arranged in a defined position, and inserting the fixation element into the tensioning part, the fixation element thereby exerting force onto the tensioning part such that a frictional connection between the tensioning part and the bearing part takes place, and such that the plug-in module is fixed with its front plate in the defined position relative to the module rack, the force exerted onto bearing part being oriented transversely to the insertion direction of plug-in module.

* * * * *